United States Patent [19]

Kobayashi et al.

[11] Patent Number: 5,003,478
[45] Date of Patent: Mar. 26, 1991

[54] DIAGNOSIS SYSTEM FOR A MOTOR VEHICLE

[75] Inventors: Tomoya Kobayashi; Kunihiro Abe; Masanori Sakamoto, all of Tokyo, Japan

[73] Assignee: Fuji Jukogyo Kabushiki Kaisha, Tokyo, Japan

[21] Appl. No.: 306,874

[22] Filed: Feb. 2, 1989

[30] Foreign Application Priority Data

Feb. 16, 1988 [JP] Japan .................................. 63-34896

[51] Int. Cl.$^5$ ...................... G01M 15/00; F02D 41/26; F02P 17/00
[52] U.S. Cl. .............................. 364/424.03; 73/117.2; 364/431.01; 364/551.01
[58] Field of Search ...................... 364/431.01, 551.01; 73/116, 117.2, 117.3, 119 R, 119 A

[56] References Cited

U.S. PATENT DOCUMENTS

| | | | |
|---|---|---|---|
| 4,527,424 | 7/1985 | Takahashi | 73/119 A |
| 4,694,408 | 9/1987 | Zaleski | 364/551.01 |
| 4,748,843 | 6/1988 | Schäfer et al. | 73/117.3 |
| 4,757,463 | 7/1988 | Ballou et al. | 364/551.01 |
| 4,926,330 | 5/1990 | Abe et al. | 364/424.03 |

FOREIGN PATENT DOCUMENTS

58-12848  1/1983  Japan .............................. 364/431.01

*Primary Examiner*—Felix D. Gruber
*Attorney, Agent, or Firm*—Martin A. Farber

[57] ABSTRACT

A system for diagnosing a motor vehicle has a diagnosis device including a computer having a central processing unit and a memory, the memory having a plurality of programs for diagnosing an electronic control system for controlling an engine. An indicator section and a display are provided. The diagnosis device has a control unit. The control unit receives input and output data of an element in the electronic control system and drives the indicator to indicate operating conditions of the element in accordance with the input and output data. On the other hand, the display displays an identification code of the element.

3 Claims, 7 Drawing Sheets

DIAGNOSIS SYSTEM FOR A MOTOR VEHICLE

BACKGROUND OF THE INVENTION

The present invention relates to a diagnosis system for a motor vehicle.

Recently, a motor vehicle is equipped with an electronic control system for controlling various components of an engine, such as fuel injectors, thereby improving driveability, exhaust gas emission, fuel consumption and engine power. The electronic control system controls the components based on information represented by output signals from various sensors for detecting engine operating conditions. Accordingly, if malfunctions of components and sensors occur, the engine does not properly operate.

However, because of the complexity of the electronic control system, it is difficult to immediately find out the trouble. Accordingly, a trouble diagnosis device for easily checking the electronic control system should be provided as equipment in an auto shop.

Japanese Patent Application Laid-Open 58-12848 discloses a diagnosis system in which an exclusive checking device is provided for measuring a pulse duration of fuel injection and engine speed, and for checking whether idling speed is normal.

In the disclosed diagnosis system, the number of items displayed on a display is limited to a small number. Accordingly, the operations of the sensors and switches can only be assumed from values indicated on the display of the checking device. For example, the disconnection of a connector for a sensor must be assumed only by checking the output voltage of the sensor which is displayed on the display.

A prior application (U.S. patent Ser. No. 246 996) filed by the applicant of the present patent application discloses a diagnosis system provided with indicators as well as a display. Each of the indicators is arranged to be intermittently turned on in dependency on a signal from a sensor or a switch, thereby enabling a diagnostician to check the operation thereof in an instant.

However, in the system, each indicator corresponds to designated sensors or switches, so that operations of only designated ones can be checked. Accordingly, if operations of all of the sensors and switches are to be checked, a large number of indicators are necessary. Thus, the diagnosis system becomes expensive, large and moreover, difficult to handle. In addition, such a diagnosis system can not be used if the controlling items of the system are increased in the future.

SUMMARY OF THE INVENTION

The object of the present invention is to provide a diagnosis system where the operations of sensors, switches and actuators can be quickly checked and the number of the checking items can be easily increased without modifying the system.

According to the present invention, there is provided a system for diagnosing a motor vehicle and an electronic control system mounted on the vehicle, comprising, a diagnosis device including a computer having a central processing unit and a memory, the memory having a plurality of programs for diagnosing the electronic control system, and display means, connecting means for connecting the computer to the electronic control system.

The display means comprises an indicator section and a display, and the diagnosis device has a control unit.

The control unit receives input and output data of an element in the electronic control system and drives the indicator to indicate operating conditions of the element in accordance with the input and output data and drives the display to display an identification code of the element.

The other objects and features of this invention will become understood from the following description with reference to the accompanying drawings.

DETAILED DESCRIPTION OF THE PREFERRED EMBODIMENT

Figure 1:
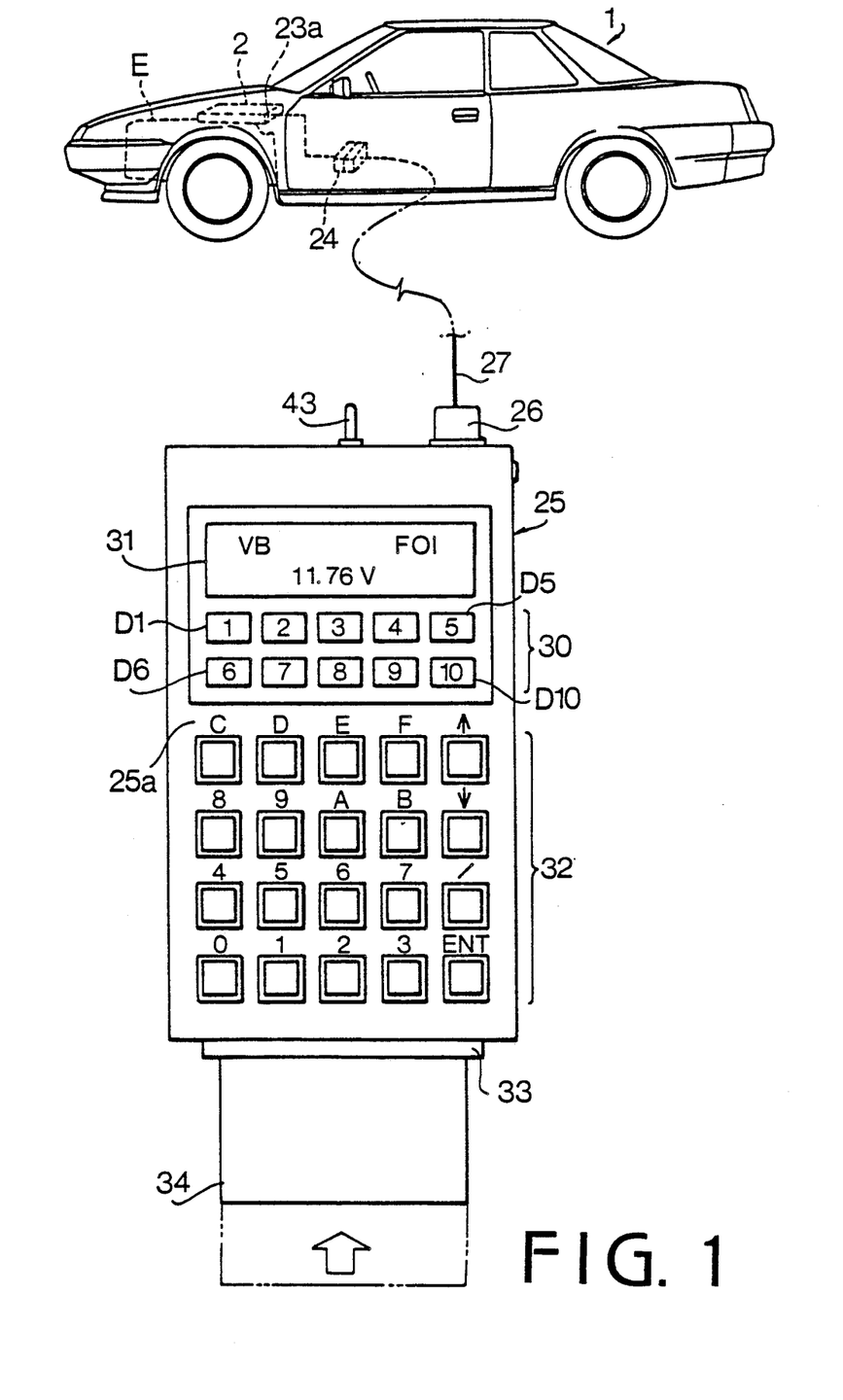
FIG. 1 is a schematic illustration of a diagnosis system according to the present invention.

Referring to FIG. 1, an automobile 1 is equipped with an electronic control system 2 for controlling various components of an engine E. The electronic control system 2 is connected to an external connector 24. A portable diagnosis device 25 comprising a microcomputer is housed in a case 25a and has a connector 26, to which the connector 24 of the system 2 is connected through an adapter harness 27.

The diagnosis device 25 has a power switch 43, a liquid crystal display 31, an indicator section 30 consisting of a plurality of LED indicators, and a keyboard 32. A connector 33 is provided for connecting a detachable memory cartridge 34.

Figure 3A:
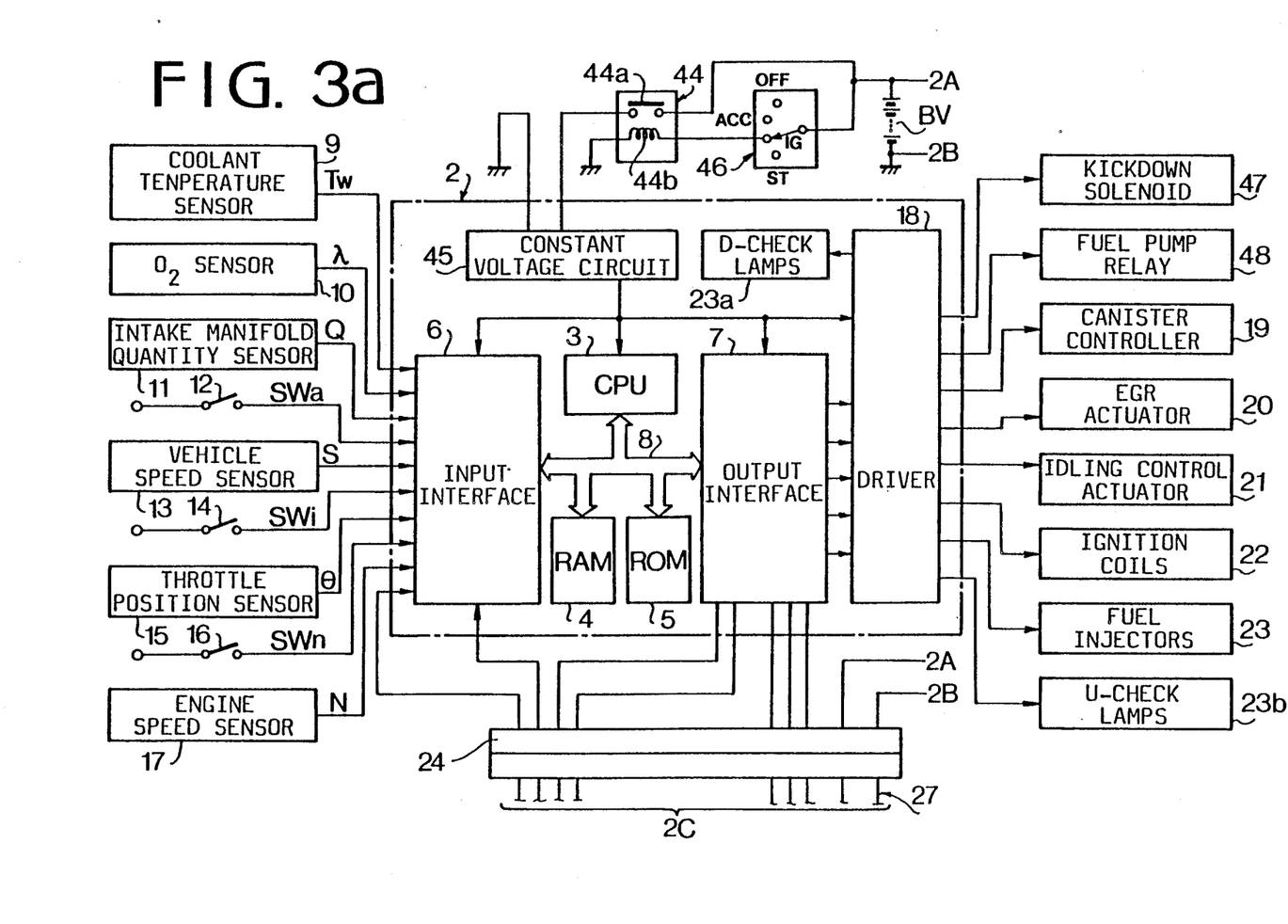
FIGS. 3a and 3b show a block diagram of the system.
Figure 3B:
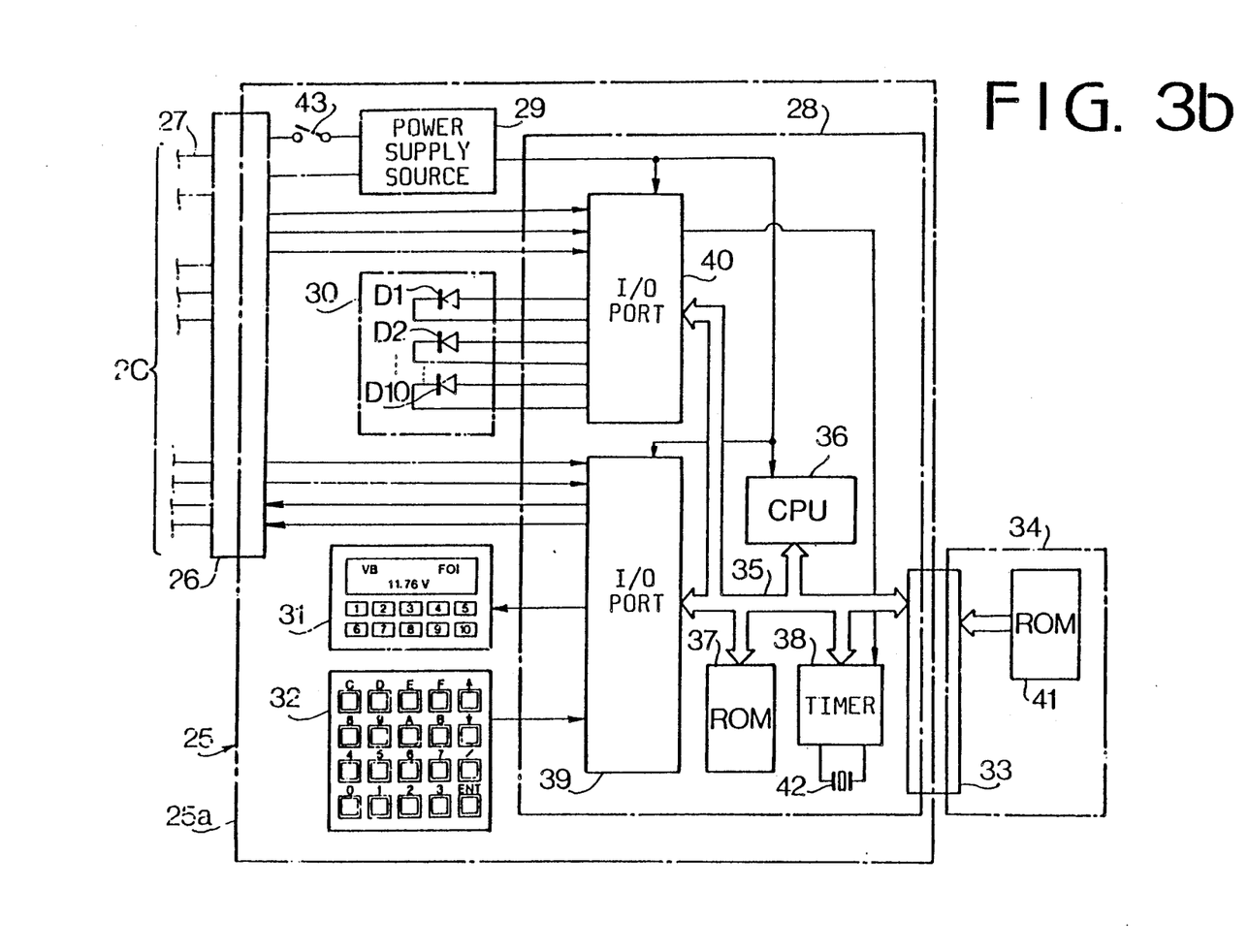

Referring to FIGS. 3a and 3b, the electronic control system 2 comprises a central processor unit (CPU) 3, a random access memory (RAM) 4, a read only memory (ROM) 5, an input interface 6 and an output interface 7. These elements, namely the CPU 3, RAM 4, ROM 5, and input and output interfaces 6 and 7 are connected to each other through a bus line 8. Programs and data for controlling the engine and fixed data such as the type of the vehicle are stored in the ROM 5. Power is supplied to the CPU 3, input and output interfaces 6 and 7, and driver 18 from a source BV through a contact 44a of a power relay 44 and a constant voltage circuit 45. A relay coil 44b of the relay 44 is connected to the source BV through an ignition terminal IG of an ignition switch 46.

The input interface 6 is applied with a coolant temperature signal Tw from a coolant temperature sensor 9, an air-fuel ratio feedback signal λ from an $O_2$ sensor 10, an intake-air quantity signal Q from an intake manifold quantity sensor 11, an air conditioner operating signal SWa from an air conditioner switch 12, a vehicle speed signal S from a vehicle speed sensor 13, an idling signal SWi from an idle switch 14, a throttle valve opening degree signal Θ from a throttle position sensor 15, a neutral positioning signal SWn from a neutral switch 16 in a transmission, and an engine speed signal N from an engine speed sensor 17. These signals are stored in the RAM 4 after processing data in accordance with the program stored in the ROM 5. The CPU 3 produces respective control signals, which are applied to the driver 18 through the output interface 7. The driver 18 produces signals for controlling a kickdown solenoid 47 of a kickdown switch, a fuel pump relay 48, a canister controller 19 of a fuel-vapor emission control system, an EGR (exhaust gas recirculation system) actuator 20, an idling control actuator 21, ignition coils 22, and fuel injectors 23.

The driver 18 further applies signals to D-check lamps 23a and U-check lamps 23b. The D-check lamps 23a are provided in the electronic control system 2 for informing an abnormality in the system 2. When an abnormality is detected in the system 2 by self-diagnosis function, a corresponding trouble code is read out from the ROM 5 so as to turn on or flash a plurality of the lamps 23a, thereby indicating the trouble code. The U-check lamps 23b are provided on a dashboard of the vehicle so as to warn the driver of the trouble detected by the self-diagnosis function.

The diagnosis device 25 has a control unit 28 and a power supply source 29. The control unit 28 comprises a CPU 36, a RAM 37, input/output (I/O) ports 39 and 40, and a timer 38. These elements are connected to each other through a bus line 35. A clock pulse generator 42 is provided for generating synchronizing pulses. A ROM 41 provided in the memory cartridge 34 is connected to the bus line 35 through the connector 33. The ROM 41 stores a plurality of programs for diagnosing various troubles of the control system 2 and fixed data, which will later be described in detail. Inputs of the I/O port 40 are connected to the output interface 7 of the control system 2 through connectors 24 and 26 and harness 27 so as to receive output signals of sensors and switches 9 to 17. Outputs of the port 40 are connected to the indicator section 30. Inputs of the I/O port 39 are connected to the keyboard 32 for being applied with a mode select signal dependent on the operation of the keyboard, and to the output interface 7. Outputs of the port 39 are connected to the input interface 6 and the display 31. The power source 29 for supplying the power to the CPU 36 and I/O ports 39 and 40 is connected to the source BV through the power switch 43.

Figure 2A:
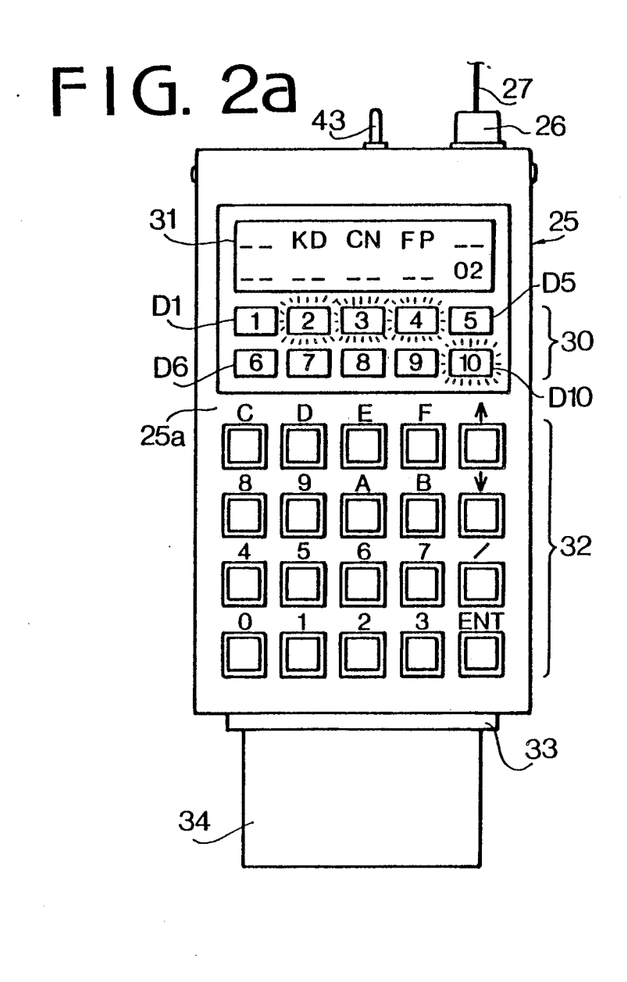
FIG. 2a shows a diagnosis device at an actuator signal checking mode.

Referring to FIG. 2a, the indicator section 30 has a plurality of LEDs $D_1$ to $D_{10}$ arranged in two rows. The liquid crystal display 31 has two rows of liquid crystal cells, each row consisting of five pairs of liquid crystal cells. Each pair of cells corresponds to respective LEDs $D_1$ to $D_{10}$. Inputting and outputting conditions of the switches and sensors are indicated by intermittently turning on the LEDs $D_1$ to $D_{10}$ in accordance with a selected checking mode. On the liquid crystal cells of the display 31, the selected switches and sensors are indicated by identification codes such as KD and CN as shown in the figures. The display 31 is also capable of displaying measured values such as output voltages and pulse widths of signals from sensors and actuators dependent on the selected mode as shown in FIG. 1.

Figure 5:
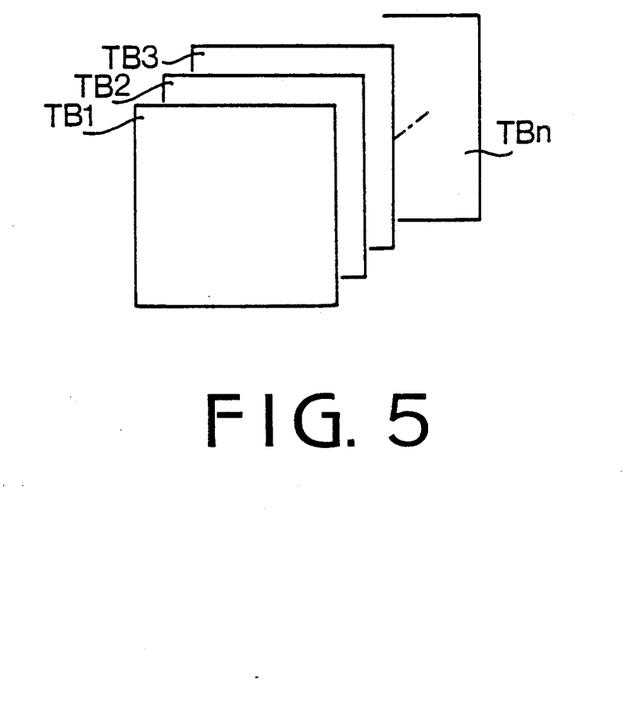
FIG. 5 is an illustration conceptually showing tables for various vehicle types stored in a ROM.
Figure 6:
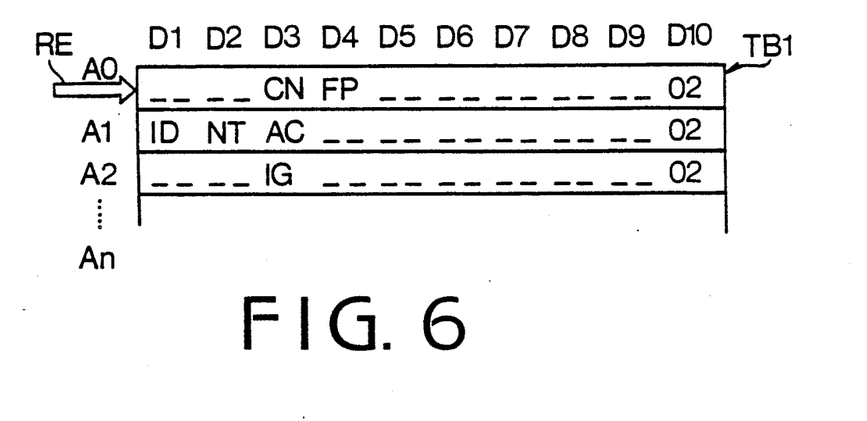
FIG. 6 is a diagram showing data in each table.

Referring to FIG. 5, the ROM 41 stores, as fixed data, a plurality of tables $TB_1$ to $TB_n$, each for the specific type of vehicle. As shown in FIG. 6, each table has a mode select register RE for selecting one of the table $TB_1$ to $TB_n$ corresponding to the selected mode and consists of the rows from $A_0$ to $A_n$. In each row are stored the identification codes for selected LEDs $D_1$ to $D_{10}$. The selected addresses of the selected row correspond to the pairs of liquid crystal cells of the liquid crystal display 31.

Figure 4:
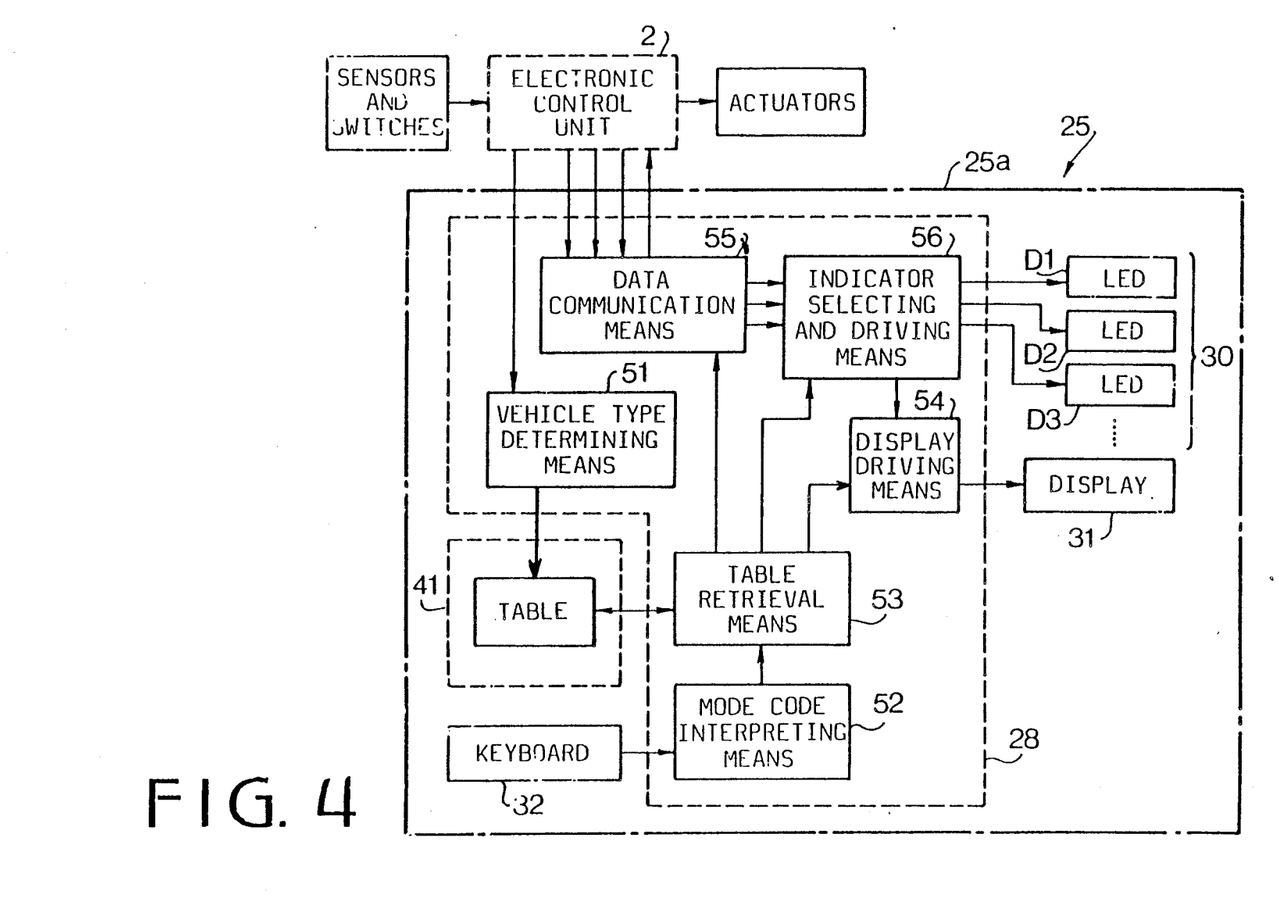
FIG. 4 is a block diagram representing operation of the main part of the diagnosis system of FIB. 3b.

The control unit 28 is described more in detail with reference to FIG. 4. The control unit 28 is provided with a vehicle type determining means 51 where the type of the vehicle stored in the ROM 5 of vehicle control system 2 is read out, and one of the tables $TB_1$ to $TB_n$ stored in the ROM 41 is selected and set, accordingly. A mode interpreting means 52 produces a mode signal in dependency on the selected mode input by the keyboard 32. The mode signal is applied to a table retrieval means 53 where a row in the selected table corresponding to the selected mode is retrieved. The data stored in each address in the row is read out.

An output signal from the retrieval means 53 is applied to a display driving means 54 which applies driving signals to appropriate liquid crystal cells in the display 31 in accordance with the data in the selected table. The output signal from the retrieval means 53 is also applied to a data communication means 55 which sends a data demand signal to the control system 2 in accordance with the derived data from the table. Data on sensors and switches in the control system 2 are applied to an indicator selecting and driving means 56 through data communication means 55 in accordance with the data demand signal. The indicator selecting and driving means 56 selects LEDs in the indicator section 30 corresponding to the retrieved row in accordance with the derived data and sends driving signals to the selected LEDs to light them in accordance with the data from the control system 2.

Before performing the diagnosis program, the control system 2 is connected to the diagnosis device 25 through the harness 27 and cartridge 34 is attached to the diagnosis device 25.

Figure 7:
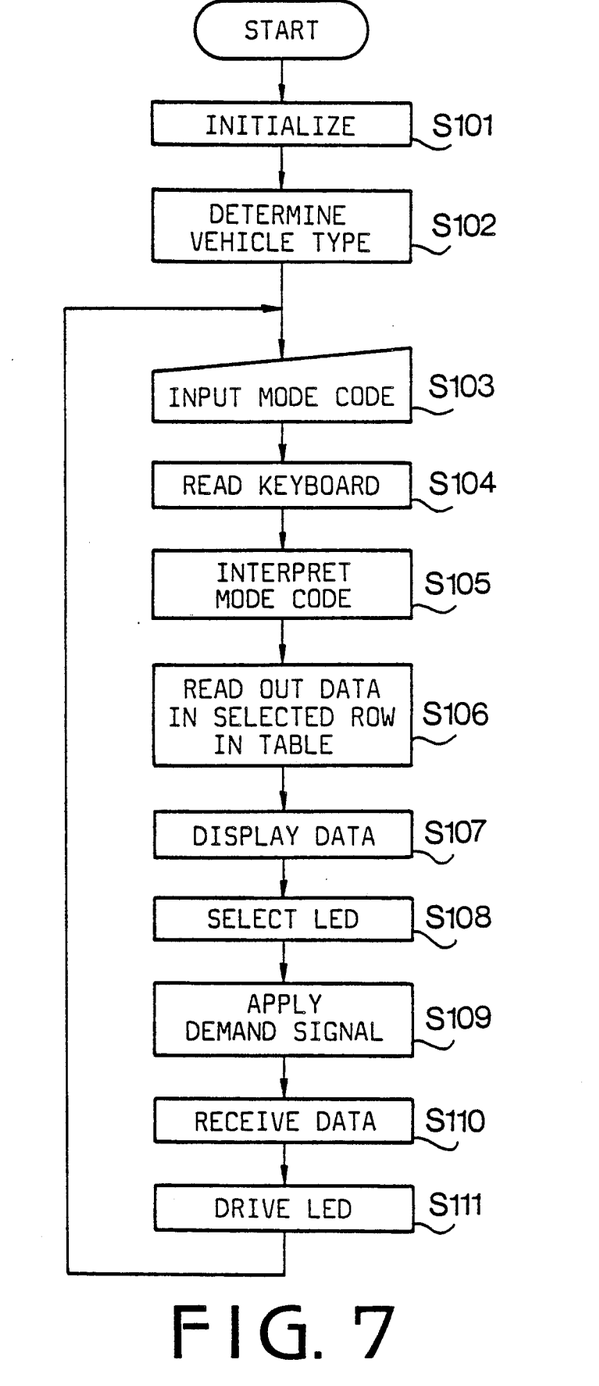
FIG. 7 is a flowchart showing an operation of the system.

The operation of the system is described hereinafter with reference to the flowchart of FIG. 7. The engine is started, and the following diagnosis program is performed under the running condition of the engine.

The power switch 43 is turned on and initialization of the control unit 28 is performed at a step S101. At a step S102, the type of the vehicle is read out from the ROM 5 of the control system 2 and a table corresponding thereto stored in the ROM 41 of the cartridge 34, for example, table $TB_1$, is selected in accordance with the type of the vehicle. A diagnostician operates the keyboard 32 to perform the diagnosis of the signals fed from the control system of the vehicle. For example, when checking signals of actuators, a mode code or mark for an actuator signal checking mode AO (for example F→A→O→ENT) is input by operating the keyboard 32 (S103). A steps S104 and 105, the mode code is read out and interpreted by the mode code interpreting means 52. At a step S106, the row $A_0$ in the table $TB_1$ is retrieved by the mode select register RE in dependency on the interpreted mode code, the row $A_0$ is looked up from the table $TB_1$, and data stored in the row is read out. The data is applied to the display driving means 54 so as to apply the driving signal to the liquid crystal display 31. Accordingly, the identification codes, (two-letter abbreviations) are displayed on the liquid crystal cells (step S107).

Referring to FIG. 2a, the identification code KD stands for a control signal applied to the kickdown solenoid 47, code CN for a control signal applied to the canister controller 19, code FP for a control signal applied to the fuel pump relay 48 and code 02 for the feedback signal λ applied to the control system 2 from the O₂ sensor 10.

At a step S108, the LEDs which correspond to the data from the table TB₁ are selected by the indicator selecting and driving means 56 and the selected LEDs are applied with the driving signals. For example, in the actuator signal checking mode A₀, the LEDs D₂ to D₄ and D₁₀ are lit as shown in FIG. 2a.

A data demand signal for the selected mode is applied to the control system 2 at a step S109. At a step S110, input and output signals of the kickdown solenoid 47, canister controller 19, fuel pump relay 48 and O₂ sensor are fed to the data communication means 55 from the control system 2. As a result, the indicator selecting and driving means 56 applies signals to the LEDs to turn on or flash the lights, thereby indicating the operating conditions of the actuators and O₂ sensor. For example, in a normal state, when the accelerator pedal is depressed more than a predetermined degree, the throttle position sensor 15 sends a kickdown signal to the kickdown solenoid 47. The kickdown signal is also fed to the diagnosis device 25 and monitored by the device. Thus, when the kickdown signal is produced the LED D₂ is turned on, informing the diagnostician that the control system 2 is normally operated so that the kickdown signal is properly applied to the kickdown solenoid 47.

On the other hand, if the kickdown solenoid 47 does not operate although the accelerator pedal is depressed more than the predetermined degree and the LED D₂ is lit, it is determined that there is a disorder in the kickdown solenoid system. If the LED is lit although the accelerator pedal is released, or to the contrary, if the LED is not lit although the accelerator pedal is sufficiently depressed, there is an abnormality in the control system or in the throttle position sensor 15 or a trouble due to short-circuiting or disconnection of the harness.

Other control signals identified by codes CN and FP can be likewise monitored. Additionally, air-fuel ratio can be monitored by lighting the LED D₁₀ in dependency on the feedback signal λ. For example, when the air-fuel mixture is rich, the LED D₁₀, is turned on and it is turned off when the mixture is lean.

Figure 2B:
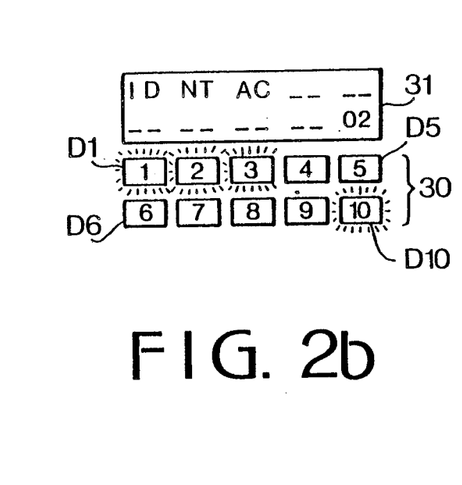
FIGS. 2b and 2c show displays and indicator sections of the diagnosis device at other signal checking modes.
Figure 2C:
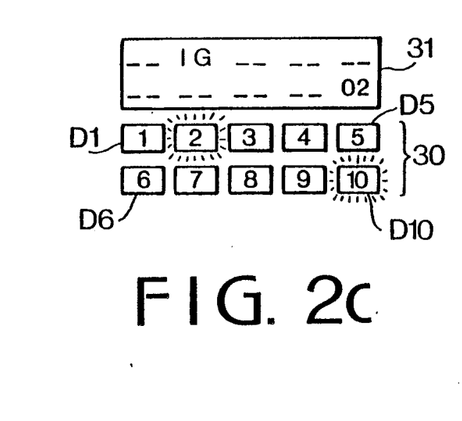

FIG. 2b shows display conditions of the display 31 and indicator section 30 when a mode Al for monitoring the switches 12, 14 and 16 are selected, and FIG. 2c shows a mode A2 for monitoring the ignition system. Each mode is carried out in the same manner as described by the steps S103 to S110 in the flowchart of FIG. 7.

In the modes A1 and A2, an identification code ID stands for the signal SWi from the idle switch 14, code NT for the signal SWn from the neutral switch 16, code AC for the signal SWa from the air-conditioner switch 12, and code IG for the output signal of the ignition switch 46. When the mode A1 is selected, if the idle switch 14 is normally operated, the LED D₁ is lit upon release of the accelerator pedal and turned off upon depression of the accelerator pedal. Namely, if the LED D₁ is lit although the accelerator pedal is released, the idle switch 14 is not functioning. Other switches can be diagnosed in the same manner.

Diagnoses such as checking the battery voltage and fuel injection pulse width can be performed when the corresponding diagnosis modes are selected by operating the keyboard 32. For example, the keyboard 32 is operated to input a mode code such as F→0→1→ENT so as to measure the battery voltage. Consequently, a diagnosis result 11.76 V, the diagnosis item in code VB and the diagnosis mode F01 are displayed on the display as shown in FIG. 1.

From the foregoing, it will be understood that the present invention provides a diagnosis system for a motor vehicle where signals of switches, sensors and actuators of a control system can be easily checked. The checking items can be increased without modifying the diagnosis system.

While the presently preferred embodiment of the present invention has been shown and described, it is to be understood that this disclosure is for the purpose of illustration and that various changes and modifications may be made without departing from the scope of the invention as set forth in the appended claims.

What is claimed is:

1. A system for diagnosing an electronic control system of an automotive engine mounted on a motor vehicle, the electronic control system having sensing means including switches for detecting operating conditions of the vehicle, means for storing output data from said sensing means and providing control data for controlling the vehicle via actuators, said output data and said control data constituting diagnosis data, the diagnosis system comprising:

a diagnosis device including a computer having a central processing unit and a memory connected to said processing unit including a code generating means for generating codes designating selected diagnosis data, the memory having a plurality of programs for diagnosing said electronic control system, and display means for displaying results of the diagnosis followed by said programs;

said display means comprising:

a plurality of indicators showing conditions of said data; and crystal display means for displaying said codes corresponding to said diagnosis data and having a plurality of cells for storing said codes corresponding to said indicators; and said diagnosis device further including driving means responsive to said codes and said diagnosis data for providing first signals to said indicators and providing second signals to said crystal display means so as to simultaneously display said codes corresponding to said diagnosis data.

2. The system according to claim 1, wherein
the plurality of indicators comprises a plurality of LEDs and the crystal display means is a liquid crystal cell.

3. In a diagnosis system for an electronic control system mounted on an engine driven motor vehicle having sensing means including switches for detecting operating conditions of the vehicle, and means for storing output data from said sensing means and providing control data for controlling the vehicle via actuators, the diagnosis system having diagnosis means responsive to at least one of said output data and control data for diagnosing said at least one data and for providing diagnosis data, display means for displaying said diagnosis data, a keyboard for inputting a mode code of a selected diagnosis mode into said diagnosis means and for producing a mode code select signal, a detachable memory cartridge detachably connected to said diagnosis means for storing a plurality of programs to diagnose said at least one data, communication means provided in said diagnosis means for transmitting said at least one data between said electronic control system and said diagnosis means, connecting means for connecting said diagnosis means with said electronic control system and said detachable memory cartridge which have different types of data signals being transmitted in response to a demand signal corresponding to said mode code select signal, the improvement in the diagnosis system, which includes a programmed computer, comprising:

table retrieval means responsive to said mode code select signal for reading out a row of a selected table corresponding to the selected diagnosis mode and for producing a corresponding output signal;

indicator selecting means responsive to said output signal and said diagnosis data from said communication means and for generating first driving signals;

display driving means responsive to said output signal and said diagnosis data for producing second driving signals corresponding to read out data in the selected table and said diagnosis data;

said display means comprises:

a plurality of indicators provided adjacent to said keyboard, said first driving signals flashing a corresponding combination of said indicators; and     a crystal display means provided adjacent to said indicators and responsive to said second driving signals for displaying identification codes corresponding to said diagnosis data so as to simultaneously and continuously display said diagnosis data corresponding to said different types of data signals without changing said detachable memory cartridge.

* * * * *